(12) United States Patent
Smith et al.

(10) Patent No.: US 6,473,279 B2
(45) Date of Patent: Oct. 29, 2002

(54) IN-STACK SINGLE-DOMAIN STABILIZATION OF FREE LAYERS FOR CIP AND CPP SPIN-VALVE OR TUNNEL-VALVE READ HEADS

(75) Inventors: Neil Smith, San Jose, CA (US); Bo Yang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 09/754,908

(22) Filed: Jan. 4, 2001

(65) Prior Publication Data

US 2002/0085323 A1 Jul. 4, 2002

(51) Int. Cl.$^7$ ................................................ G11B 5/39
(52) U.S. Cl. .............................. 360/324.12; 360/113
(58) Field of Search .......................... 360/113, 224.12; 324/252, 207.21; 204/192.11, 192.2

(56) References Cited

U.S. PATENT DOCUMENTS

| 5,159,513 A | | 10/1992 | Dieny et al. ................ 360/113 |
| 5,206,590 A | | 4/1993 | Dieny et al. ................ 324/252 |
| 5,408,377 A | | 4/1995 | Gurney et al. ............... 360/113 |
| 5,465,185 A | * | 11/1995 | Heim et al. .................. 360/113 |
| 5,528,440 A | | 6/1996 | Fontana et al. ............. 360/113 |
| 5,701,223 A | | 12/1997 | Fontana, Jr. et al. ........ 360/113 |
| 5,729,410 A | | 3/1998 | Fontana, Jr. et al. ........ 360/113 |
| 5,766,743 A | * | 6/1998 | Fujikata, et al. ............. 428/212 |
| 5,871,622 A | * | 2/1999 | Pinarbasi ................ 204/192.11 |
| 5,891,586 A | * | 4/1999 | Hasegawa et al. ........... 428/668 |
| 6,023,395 A | | 2/2000 | Dill et al. ..................... 360/113 |
| 6,057,049 A | * | 5/2000 | Fuke et al. .................. 428/700 |

OTHER PUBLICATIONS

J.L. Leal, and M. Kryder, "Interlayer Coupling in Spin Valve Structures," IEEE Transactions on Magnetics, vol. 32, No. 5, Sep. 1996.

* cited by examiner

Primary Examiner—Allen Cao
Assistant Examiner—Dzung C. Nguyen
(74) Attorney, Agent, or Firm—Lumen Intellectual Property Services, Inc.

(57) ABSTRACT

An improved MR sensor has a ferromagnetic free layer whose magnetization is stabilized by an in-stack three layers combination, which including an auxiliary ferromagnetic layer proximate the ferromagnetic free layer, a non-magnetic spacer layer disposed between the ferromagnetic free layer and the auxiliary ferromagnetic layer, and a pinning layer adjacent to the auxiliary ferromagnetic layer. The pinning layer is directly exchange-coupled to the auxiliary ferromagnetic layer such that the magnetization of the auxiliary ferromagnetic layer is pinned. The non-magnetic spacer layer is made of a material, such as Ru, which induces an anti-ferromagnetic exchange coupling between the ferromagnetic free layer and the auxiliary ferromagnetic layer. The magnetization of the ferromagnetic free layer is stabilized in a single-domain state by the combination of the anti-ferromagnetic exchange-coupling and magnetostatic coupling between the ferromagnetic free layer and the auxiliary ferromagnetic layer.

29 Claims, 6 Drawing Sheets

IN-STACK SINGLE-DOMAIN STABILIZATION OF FREE LAYERS FOR CIP AND CPP SPIN-VALVE OR TUNNEL-VALVE READ HEADS

FIELD OF THE INVENTION

This invention relates generally to magnetoresistive sensors. More particularly, it relates to the stabilization of free layers' magnetizations of magnetoresistive sensors.

BACKGROUND ART

Thin film magnetoresistive (MR) sensors or heads have been used in magnetic data storage devices for several years. Physically distinct forms of magnetoresistance such as anisotropic magnetoresistance (AMR), giant magnetoresistance (GMR) and spin tunneling magnetoresistance (TMR) are well-known in the art. Magnetic read-back sensor designs have been built using these principles and other effects to produce devices capable of reading high density data. In particular, three general types of magnetic read heads or magnetic readback sensors have been developed: the anisotropic magnetoresistive (AMR) sensor, the giant magnetoresistive (GMR) sensor or GMR spin valve, and the magnetic tunnel junction (MTJ) sensor. The construction of these sensors is discussed in the literature, e.g., in U.S. Pat. No. 5,159,513 or U.S. Pat. No. 5,206,590.

For maximum spin-valve or tunnel-valve head stability and response linearity without hysteresis, it is generally desired, in the absence of any other source of external magnetic field on the free (or sensing) layer, that the magnetization of the free layer be maintained in a saturated single domain state. In such a state, the local magnetization everywhere in the free layer, up to and including the track-edges, will remain essentially "longitudinal", i.e., co-linear with the cross-track direction of the head, parallel to the plane of the magnetic recording medium, and orthogonal to the direction of "transverse" magnetic signal fields emanating from a magnetic medium proximate the sensor.

The prior art has used a method of "hard-bias" or edge-coupling-only to stabilize the magnetization of free (or sensing) layers of MR sensors. FIG. 1 illustrates the basic components of a typical current-in-plane (CIP) GMR sensor 100 with hard bias layers of the prior art. The sensor 100 includes a ferromagnetic reference layer 106 with a fixed transverse magnetic moment (pointing into the page) and a ferromagnetic free layer 110 with a rotatable magnetization vector, which can rotate about the longitudinal direction in response to transverse magnetic signal fields. The direction of the magnetic moment of the reference layer 106 is typically fixed by exchange coupling with an antiferromagnetic layer 104. Exchange-pinned reference layer 106 and free layer 110 are separated by a thin electrically conductive nonmagnetic layer 108. Hard bias layers 112 provide a longitudinal biasing magnetic field to stabilize the magnetization of the free layer 110 approximately in a longitudinal orientation in the absence of other external magnetic fields. Sensor 100 further includes top electrical leads 114 in proximity with hard bias layers 112, and a layer 102 adjacent to the antiferromagnetic layer 104, which represents a combination of the substrate, undercoat, and seed layers. For a shielded sensor, layer 102 may additionally include the bottom shield and insulation layers (for CIP sensors) or electrical contact layers (for CPP sensors).

FIG. 2 shows a current-perpendicular-to-plane (CPP) sensor 200 with hard bias layers of the prior art. CPP sensor 200 includes a ferromagnetic reference layer 206 with a fixed magnetic moment oriented transversely (into the page) and a ferromagnetic free layer 210 with a rotatable magnetization vector, which can rotate about the longitudinal direction in response to transverse magnetic signal fields. The direction of the magnetic moment of the reference layer 206 is typically fixed by exchange coupling with an antiferromagnetic layer 204. The exchange-pinned reference layer 206 and free layer 210 are spaced apart by a non-magnetic layer 208. For MTJ devices, layer 208 includes an electrically insulating tunnel barrier layer. For CPP-GMR devices, layer 208 is electrically conductive, and is analogous to layer 108 of the CIP-GMR sensor of FIG. 1. Hard bias layers 212 are electrically insulated from the sensor stack and the top electrical lead 216 by insulating layers 214 and 218 respectively. Hard bias layers 212 provide a longitudinal biasing magnetic field to stabilize the magnetization of the free layer 210. Sensor 200 further includes a layer 202, which is similar to layer 102 of sensor 100, in proximity with the antiferromagnetic layer 204.

An important concern in the design of the sensors of FIGS. 1 and 2 is the longitudinal bias of the free layers. It is desired that the hard bias layers maintain the free layer's magnetization in a longitudinally oriented, single domain state. In the absence of longitudinal bias, the magnetization of free layer tends to establish a multi-domain state, as is well-known. Free layers in multi-domain states may experience Barkhausen jumps and other domain reorientation phenomena when responding to external magnetic fields from the encoding data bit in a magnetic recording disk. This problem is also known in the art and is highly undesirable as it produces hysteresis noise and worsens the signal-to-noise ratio (SNR) of the sensor.

However, the most common technique of the prior art includes the fabrication of magnetically hard (permanent magnet) bias layers which form an abutted junction with the physical track edges of the GMR sensor. For a CPP sensor, there exists the additional complication of maintaining an insulating spacer layer between the junction of the hard bias layers and the CPP stack. The efficacy of the method of stabilization depends critically on the precise details of the junction geometry, which is difficult to accurately control using present fabrication methods. The main source of this fabrication difficulty is the necessity of depositing and defining the hard-bias junction after the track width of the MR sensor is defined and patterned lithographically, and hence is subjected to the known fabrication and dimensional tolerances associated with this process.

An intrinsic consequence of any form of single domain stabilization of the free layer is the associated magnetic "stiffness" of the free layer, which limits its rotational response to the magnetic signal fields from the recorded bits on the magnetic recording medium. For hard-bias, the stabilization mechanism is magnetostatic coupling to the free layer predominantly at or near the track edges proximate to the hard-bias junction. For edge-coupling-only stabilization in general, the average magnetic stiffness can progressively increase as read track widths shrink and track edges become relatively more proximate, and hence more tightly coupled, to the entire volume of the read head. The stiffness issue will be further exacerbated via the practical necessity of "over-bias", in which the magnetic moment ratio $(M_s{}^*t)_{bias}/(M_s{}^*t)_{free}$ of the deposited hard-bias layer to that of free layer is designed to be several times greater than the theoretical minimum in order to compensate for the non-idealities (e.g., low coercivity) and geometric fabrication tolerances of actual hard-bias junctions. Further, the degree of required "over bias" is governed by the aforementioned fabrication tolerances, which are hard to control and hence difficult to design for.

U.S. Pat. No. 6,023,395 issued Feb. 8, 2000 to Dill et al. discloses a MTJ sensor, which includes, in addition to the necessary multitude of magnetic and nonmagnetic layers comprising a basic MTJ device known in the art, an extra in-stack ferromagnetic "biasing" layer which is coupled exclusively magnetostatically with the ferromagnetic free layer. When the magnetization of the bias layer is essentially rigidly maintained with approximately longitudinal orientation, the disclosed purpose of the biasing layer is to provide some degree of longitudinal stabilization of the free layer. The form of in-stack stabilization described by Dill avoids some of the fabrication difficulties inherent to conventional hard-bias stabilization. However, the form in-stack stabilization described by Dill will suffer from the previously described read head sensitivity limitations of edge-coupling-only stabilization schemes if single domain stability is achieved. For example, it can be shown that the aforementioned "over-bias" issue of $(M_s*t)_{bias}/(M_s*t)_{free} > 1$ is a theoretical requirement for achieving single-domain stability using an in-stack stabilization geometry relying solely on magnetostatic (edge) coupling, such as described by Gill. If as disclosed by Gill, the ferromagnetic "biasing" layer includes an exchange-pinned soft ferromagnetic layer, the high moment $(M_s*t)_{bias}$ of the biasing layer exacerbates the difficulty in achieving adequate exchange coupling between pinning and bias layers in order that the latter be maintained with magnetization rigidly aligned longitudinally.

There is a need, therefore, for an improved MR sensor having a free layer magnetization stabilized in a single-domain-state, which minimizes and/or accurately controls the trade-off between the stability and the sensitivity, and which has a favorable track-width scaling.

OBJECTS AND ADVANTAGES

Accordingly, it is a primary object of the present invention to provide an MR sensor having a free layer's magnetization maintained in a saturated single-domain-state in the absence of any external magnetic field.

It is a further object of the invention to provide a MR sensor with in-stack stabilization that minimizes the trade-off adjustability between the stability and sensitivity.

It is an additional object of the invention to provide a MR sensor having favorable track-width scaling.

It is another object of the present invention to provide a MR sensor with in-stack stabilization, which is manufacturable.

SUMMARY

These objects and advantages are attained by MR sensor having in-stack single-domain stabilization of ferromagnetic free layers.

According to a first embodiment of the present invention, a MR sensor, such as a CIP-GMR sensor or a CPP-GMR/MTJ sensor, includes a ferromagnetic reference layer with fixed (pinned) magnetization, a ferromagnetic free layer and a first non-magnetic spacer layer disposed between the ferromagnetic reference layer and the ferromagnetic free layer such that the ferromagnetic free layer's magnetization may rotate freely and independently of the magnetization of the pinned ferromagnetic reference layer. The MR sensor also includes a second non-magnetic spacer layer proximate to, and disposed between, the ferromagnetic free layer and a first auxiliary ferromagnetic layer, along with a second exchange-pinning layer for pinning the direction of orientation of the magnetization of the first auxiliary ferromagnetic layer. The MR sensor further includes a first exchange-pinning layer adjacent to the ferromagnetic reference layer for exchange-pinning the magnetization of the ferromagnetic reference layer. Alternatively, the MR sensor may include a ferromagnetic "keeper" layer adjacent to the first exchange-pinning layer, and a third non-magnetic spacer layer disposed between the ferromagnetic "keeper" layer and the ferromagnetic reference layer. The pinning directions set by the first and second exchange-pinning layers are nominally orthogonal, the first exchange-pinning layer being designated to fix the orientation of the reference layer in a "transverse" direction, and the second exchange-pinning layer being designated to pin the orientation of the first auxiliary ferromagnetic layer in a "longitudinal" direction. The MR sensor optionally includes a second auxiliary ferromagnetic layer adjacent to the second exchange-pinning layer, such that the magnetization of the second auxiliary ferromagnetic layer is pinned parallel to that of the first auxiliary ferromagnetic layer.

The second non-magnetic spacer layer is made of a material, such as Ru, which induces an anti-ferromagnetic RKKY-like exchange coupling between the ferromagnetic free layer and the first auxiliary ferromagnetic layer, promoting anti-parallel (AP) alignment between the magnetizations of these two layers. The third non-magnetic spacer layer also includes a similar (though not necessarily identical) AP coupling layer to promote anti-parallel alignment of the magnetizations of the ferromagnetic reference and "keeper" layers.

The exchange-pinning layers are typically made of an antiferromagnetic (AF) material, or alternatively, a ferrimagnetic material. One or both of the first and second exchange-pinning layers also may be made of a non-conductive material to reduce the shunt loss of the sensed current in a current-in-plane (CIP) GMR sensor design.

The ferromagnetic free layer is longitudinally stabilized through a combination of AP exchange coupling and magnetostatic coupling between the nominally anti-parallel ferromagnetic free layer and the first auxiliary ferromagnetic layer. The combined approach of exchange plus magnetostatic stabilization minimizes; the respective drawbacks that may occur if either stabilization method is used exclusively. Furthermore, the in-stack stabilization structure maintains a more favorable and adjustable track-width scaling as track-width is reduced. Fabrication of MR sensors with in-stack stabilization structure is more readily manufacturable since all the sensor layers and bias layers are deposited in-stack.

MR sensors of the type described in the first embodiment may be incorporated into MR sensing heads according to a second embodiment of the present invention. A MR sensing head includes a first shield proximate a first gap, a second shield proximate a second gap, and a MR sensor disposed between the first and the second gaps.

MR sensing heads of the type depicted in the second embodiment may be incorporated into a disk drive according to a third embodiment of the present invention. A disk drive includes a magnetic recording disk connected to a motor and a MR sensing head connected to an actuator. The motor spins the magnetic recording disk with respect to the MR read/write head, and the actuator positions the MR sensing head relative to the magnetic recording disk.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
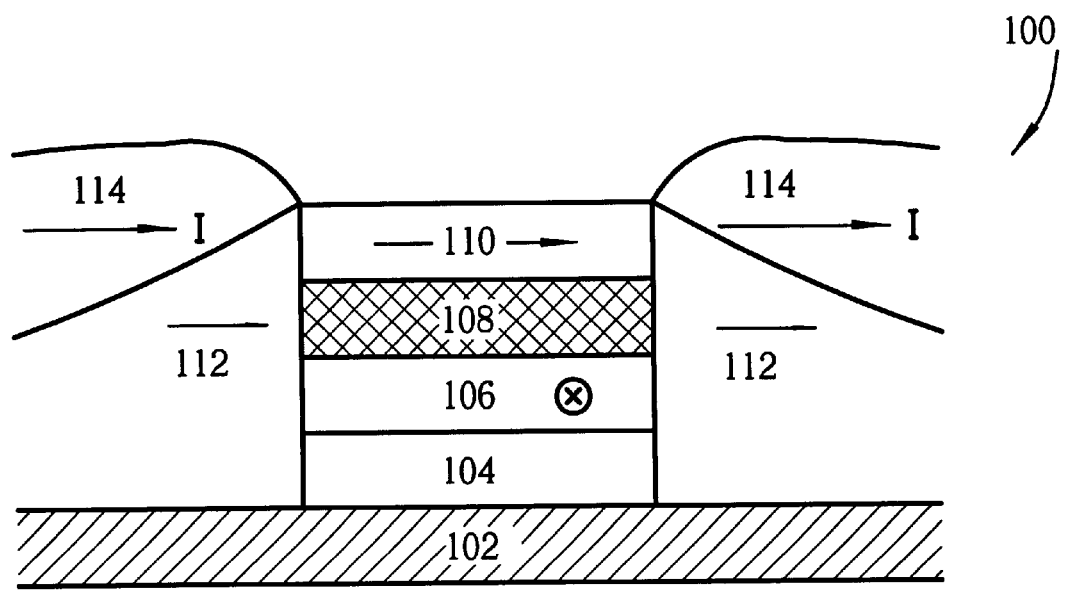
FIG. 1 depicts a cross-sectional schematic diagram of a CIP-GMR sensor with hard bias layers of the prior art.
Figure 2:
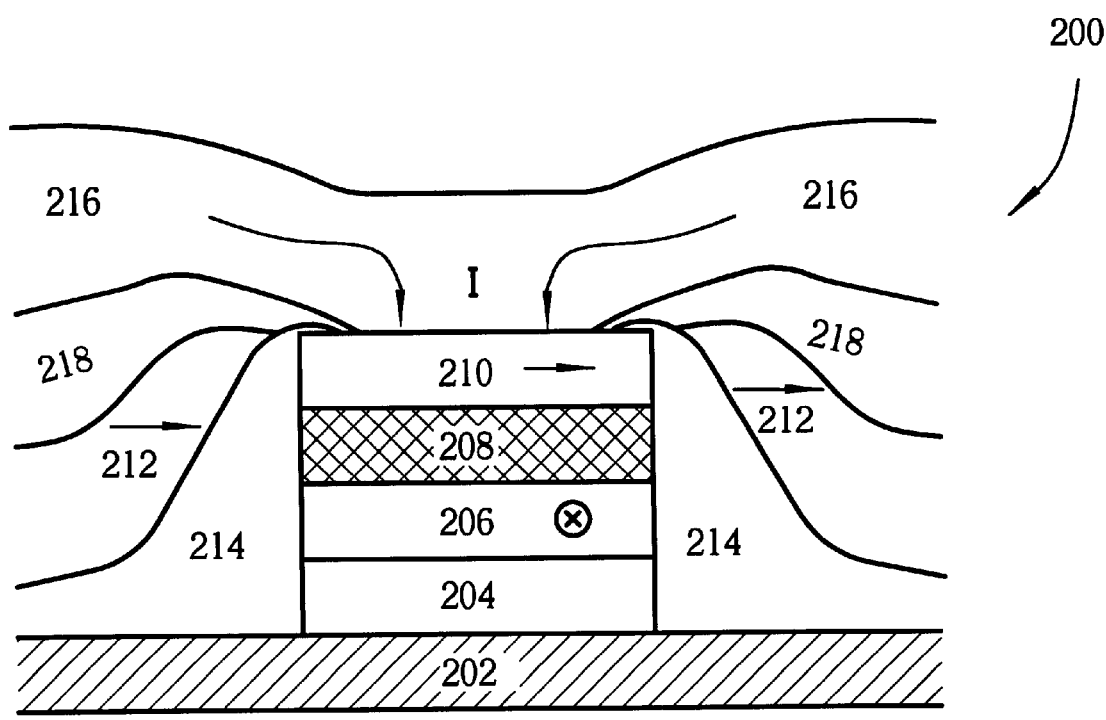
FIG. 2 depicts a cross-sectional schematic diagram of a CPP sensor with hard bias layers of the prior art.
Figure 3A:
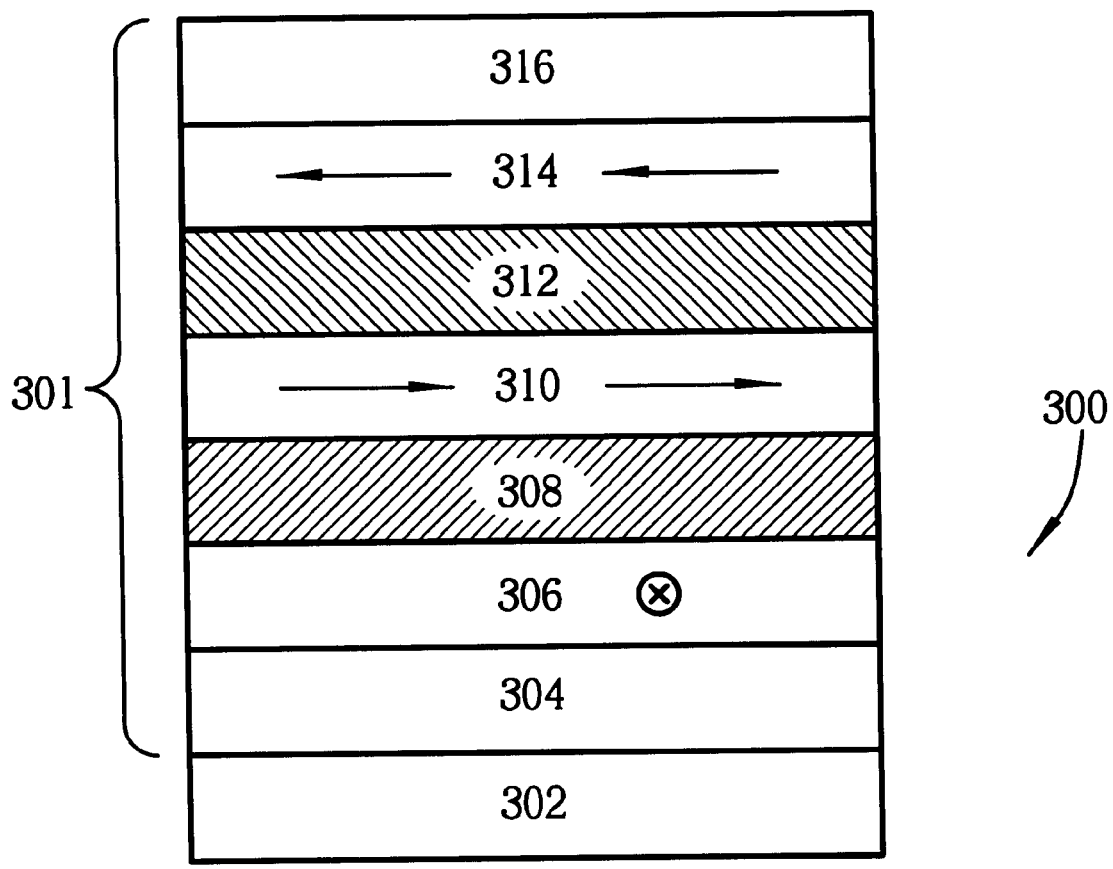
FIG. 3A depicts a cross-sectional schematic diagram of a magnetoresistive sensor with in-stack longitudinal bias according to a first embodiment of the present invention.

A first embodiment of the present invention is shown in FIG. 3A, which is a cross-sectional schematic diagram of a magnetoresistive (MR) sensor 300. MR sensor 300 includes a substrate 302 and a thin-film layered structure 301 deposited on the substrate 302. Thin-film layered structure 301 includes a ferromagnetic reference layer 306, a ferromagnetic free layer 310, and a first nonmagnetic spacer layer 308 disposed between the ferromagnetic reference layer 306 and the ferromagnetic free layer 310. The MR sensor 300 also includes a first auxiliary ferromagnetic layer 314, a second nonmagnetic spacer layer 312 disposed between the ferromagnetic free layer 310 and the first auxiliary ferromagnetic layer 314, and a second exchange-pinning layer 316 adjacent to the first auxiliary ferromagnetic layer 314. The second exchange-pinning layer 316 longitudinally pins the magnetization of the first auxiliary ferromagnetic layer 314 through a direct exchange coupling between these two layers. The MR sensor 300 further includes a first anti-ferromagnetic (AF) exchange pinning layer 304 for transversely exchange-pinning the magnetization direction of the ferromagnetic reference layer 306 along an axis primarily parallel to a direction of an external transverse magnetic field to be sensed. Therefore, the magnetization direction of the ferromagnetic reference layer 306 remains essentially fixed, while the magnetization of the ferromagnetic free layer 310 may be rotated in the presence of the external magnetic field. Appropriate seed layer(s) and undercoat between the substrate 302 and the AF layer 304, which are similar to layer 102 of sensor 100 in FIG. 1, and capping layers atop the second exchange-pinning layer 316, which is not shown in FIG. 3, may also be included.

The ferromagnetic free layer 310 and the first auxiliary ferromagnetic layer 314 are typically made of a material containing Ni, Fe, Co or alloys of Ni, Fe and Co such as NiFe, NiCo, and FeCo and the like. However, the choice of the materials for the first auxiliary ferromagnetic layer 314 may be made independently of that of the ferromagnetic free layer 310. The ferromagnetic reference layer 306 is typically made of Co or an alloy of Co. The first nonmagnetic spacer layer 308 is typically made of a highly electrically conductive nonmagnetic material such as Cu if sensor 300 is a CIP or CPP GMR or spin valve sensor. Alternatively nonmagnetic spacer layer 308 may be made of an insulating, tunneling barrier such as $Al_2O_3$ if the MR sensor 300 is a MTJ sensor. The AF layer 304 is typically made of a material containing Mn such as FeMn, PtMn, IrMn, PdPtMn and NiMn.

The exchange-pinning layer 316 would most commonly be made of anti-ferromagnetic (AF) materials similar to those described earlier for AF layer 304, though either may alternatively include ferrimagnetic materials. The exchange-pinning layer 316 is directly exchange-coupled to the first auxiliary ferromagnetic layer 314 along an axis that is primarily orthogonal to the magnetization direction of the ferromagnetic reference layer 306, such that a magnetization of the first auxiliary ferromagnetic layer 314 is essentially fixed with a longitudinal orientation. The exchange-pinning layer 316 may also be made of a non-conductive material to reduce shunting loss of the sense current in CIP designs. The second nonmagnetic layer 312 includes a conductive, non-magnetic material, such as Ru, Cr, Ir and their alloys, which mediates an anti-ferromagnetic RKKY-like (RKKY stands for Ruderman, Kittal, Kasuya, and Yosida and is known in the art as RKKY) exchange coupling between free layer 310 and the first auxiliary ferromagnetic layer 314, which promotes an anti-parallel (AP) alignment between the magnetizations of the ferromagnetic free layer 310 and the first auxiliary ferromagnetic layer 314.

For the present invention, achieving single domain stability for the ferromagnetic free layer 310 necessitates simultaneously achieving single domain stability in the first auxiliary ferromagnetic layer 314. This occurs through their mutual interactions, which include both AP exchange-coupling and magnetostatic (edge) coupling between the auxiliary layer 314 (which is also strongly longitudinally exchange pinned by pinning layer 316) and the nominally anti-parallel, but more easily rotated free layer 310. Single-domain-stabilization of both layers can occur because their combined interactions overcome the destabilizing influence of their highly spatially non-uniform longitudinal demagnetizing fields $H_{demag}$, which are generally by far largest in magnitude at/near the (track) edges of either layer. The exchange-coupling component of their interaction (mutual AP coupling plus exchange pinning of the auxiliary layer 314 by the second pinning layer 316) provides in effect spatially uniform longitudinal "exchange-fields" $H_{ex-free}$ and $H_{ex-aux} > H_{ex-free}$ over the entire track-width area of both layers, respectively. Intralayer exchange stiffness of these ferromagnetic layers also energetically favors spatially uniform magnetization orientation. For sufficiently thin films, the combined influence of uniform "exchange-fields" $H_{ex}$ and intralayer exchange stiffness can achieve longitudinal single-domain-stabilization in either film even when $H_{ex}$ does not exceed $Hd_{demag}$ at/near the track-edges (where the spatial range of maximum $H_{demag}$ scales with film thickness).

However, the magnetostatic (edge) coupling between ferromagnetic layers 310 and 314, which nominally have mutually anti-parallel, longitudinal magnetization orientations, can significantly reduce the mean $H_{demag}$ relative to that for the single domain states of either ferromagnetic layer when considered in isolation. Hence, compared to in-stack stabilization of a single free layer exclusively by directly exchange coupling to an AF pinning layer, the combined use of free and auxiliary layers 310 and 314 significantly reduces the minimum critical exchange fields $H_{ex-min}$ for single-domain stabilization requirements. This helps the practical realization of this stabilization using available exchange pinning materials for layer 316, and minimizes design trade-offs of stability robustness with free-layer magnetic stiffness. By way of further comparison, stabilization schemes relying exclusively on magnetostatic (edge) coupling inevitably provide magnetic biasing fields $H_{bias}$ on the ferromagnetic free layer 310 with similar spatial inhomogeneity to that of $H_{demag}$. Hence, the magnitude $H_{bias}$ must essentially everywhere exceed $H_{demag}$ if true single domain stability is to be achieved. In practice, this leads to the required "over-biasing" described earlier.

Let $J_{pin}$ denote the exchange pinning strength (energy) per unit area for the exchange-coupling between the first auxiliary ferromagnetic layer 314 and the second exchange pinning layer 316. The exchange pinning interaction effects an equivalent (longitudinal) "pinning field" $H_{pin}=J_{pin}/(M_s^* t)_{aux}$ as seen by auxiliary layer 314. Similarly, let $J_{ap}$ denote the exchange coupling strength for the AP coupling between the ferromagnetic free layer 310 and auxiliary layer 314. The aforementioned requisite single domain stabilization of the auxiliary layer requires a minimum critical pinning strength $J_{pin-min}$, which scales strongly (approximately as $(M_s^* t)^2_{aux}$) with the auxiliary layer moment. Micromagnetic computations indicate that the aforementioned combination of exchange-pinning plus (AP+magnetostatic)-coupling can permit combined auxillary/free-layer single-domain-stabilization at "under-bias" design points with moment ratio $r_{a/f}=(M_s^* t)_{aux}/(M_s^* t)_{free}<1$. For a given (independently optimized) choice for $(M_s^* t)_{free}$, this can substantially reduce $J_{pin-min}$ and hence substantially increase the robustness of achievable stability. Further, the flexibility in choice of material for the first auxiliary ferromagnetic layer 314 independent of that of the ferromagnetic free layer 310 permits maximization of the achievable pinning strength $J_{pin}$ without compromising desired physical/magnetic properties of the material choice for the ferromagnetic free layer 310.

At a given single-domain stabilized design point, the free layer 310 will consequently experience an effective, uniform internal "stiffness-field" $H'_{stiff}$ which resists the rotation of the nominally longitudinally magnetized free layer in response to transverse signal fields. For the present invention, $H'_{stiff}$ arises from the aforementioned exchange-pinning plus AP-coupling. It may be estimated form the following equation:

$$H'_{stiff}=r_{a/f}^* H_{pin}/[1+J_{pin}/J_{ap}-r_{a/f}] \quad (1)$$

In robust design practice, one would generally prefer to choose materials for auxiliary ferromagnetic layer 314 and second exchange pinning layer 316 to maximize the obtainable $J_{pin}>J_{pin-min}$ within the limits of compatibility with the remaining layer structure of the GMR-spin valve or TMR sensor. Values of $J_{pin}$ between 0.1 and 0.2 erg/cm² are achievable using known AF materials (e.g., PtMn or IrMn) for layer 316, and NiFe or CoFe alloys for layer 314. Subsequently, the present invention allows for considerable design flexibility on $H'_{stiff}$ through design choice of $r_{a/f}$ and $J_{ap}$, even within the preferred restriction that $r_{a/f}$ is less than or equal to 1. This is particularly true given that $J_{ap}$ values between zero and approximately 0.5–1.0 erg/cm² can be achieved through choice of material (e.g., Ru and/or alloy) and the thickness for the second nonmagnetic spacer layer 312. Hence, a wide ratio range of $J_{pin}/J_{ap}$ may be obtainable in practice.

Micromagnetic simulations suggest that within the constraint $r_{a/f}$ less than or equal to one and amplitude limitations on $J_{pin}$ amplitude stated above, there are a continuum of single-domain-stable design point across the following two design regimes:

1) thin $t_{free}$ (e.g., $(M_s^* t)_{free}/(M_s^{NiFe})$ is less than or equal 2.5 nm) and low $H'_{stiff}$ (e.g., $J_{pin}/J_{ap}$ is greater than one) for maximizing free layer sensitivity to signal fields, or 2) thicker $t_{free}$ (e.g., $(M_s^* t)_{free}/M_s^{NiFe}$ is less than 5 nm) and large $H'_{stiff}$ (e.g., $J_{pin}/J_{ap}$ is less than 0.5) for minimizing thermal fluctuations of the transverse component of the free layer magnetization.

Once stabilized, the free layer's net stiffness-field is approximately $\{H_{Stiff}\}=H'_{stiff}-\{H_{demag}\}>0$, where $\{\ \}$ denotes a spatial average over the ferromagnetic free layer 310. For magnetostatic edge-coupling stabilization such as hard-bias, the expression $\{H_{stiff}\}=\{H_{bias}-H_{demag}\}$ instead applies. Given the similar spatial character of $H_{bias}$ and $H_{demag}$, this may be roughly approximated as $\{H_{stiff}\}=(B-1)^*\{H_{demag}\}$, where minimum required "over-bias" factors $B_{min}>1$. The mean longitudinal demagnetizing field $\{H_{demag}\}$ increase with decreasing track-width (TW), roughly as $1/(TW)^n$ with $1<n<2$. As track-widths for magnetic storage systems will inevitably be scaled down in future products, $\{H_{stiff}\}$ must progressively increase for magnetostatic edge-coupling stabilization methods such as hard-bias, resulting in potential serious loss of signal. By contrast, $\{H_{stiff}\}$ will tend to decrease as TW is reduced for the present invention, assuming $H'_{stiff}$ is held constant. (Dominated by edge effects, $J_{pin-min}$ and $B_{min}$ should be relatively constant with TW). However, since the present invention allows control of $H'_{stiff}$ as well as $\{H_{demag}\}$ through "in-stack" parametric variation of $J_{pin}/J_{ap}$ and $r_{a/f}$, the current invention allows some flexibility in control on how $\{H_{Stiff}\}$ will scale with TW reduction. By contrast, the analogous control of the "over-bias" factor B for hard-bias stabilization is seriously limited by aforementioned fabrication tolerances of the abutted junction geometry which become progressively more problematical as TW is decreased.

The MR sensor 300 with in-stack stabilization may be fabricated by photolithography or electron beam lithography without extra photo-lithographic step of depositing a hard bias layer, which is needed in the case of a conventional hard-bias stabilization well-known in the art. Thus the MR sensor 300 is more manufacturable than prior art MR sensors, particularly for TW<<1 micron devices. Furthermore, in-stack stabilization structure of the MR sensor 300 is particularly favorable for CPP sensors (MTJ or GMR sensors) since there is no need for maintaining electrical insulation layer between the bias layer and the sensor layer stack as in the case of using conventional hard bias fabrication.

Figure 3B:
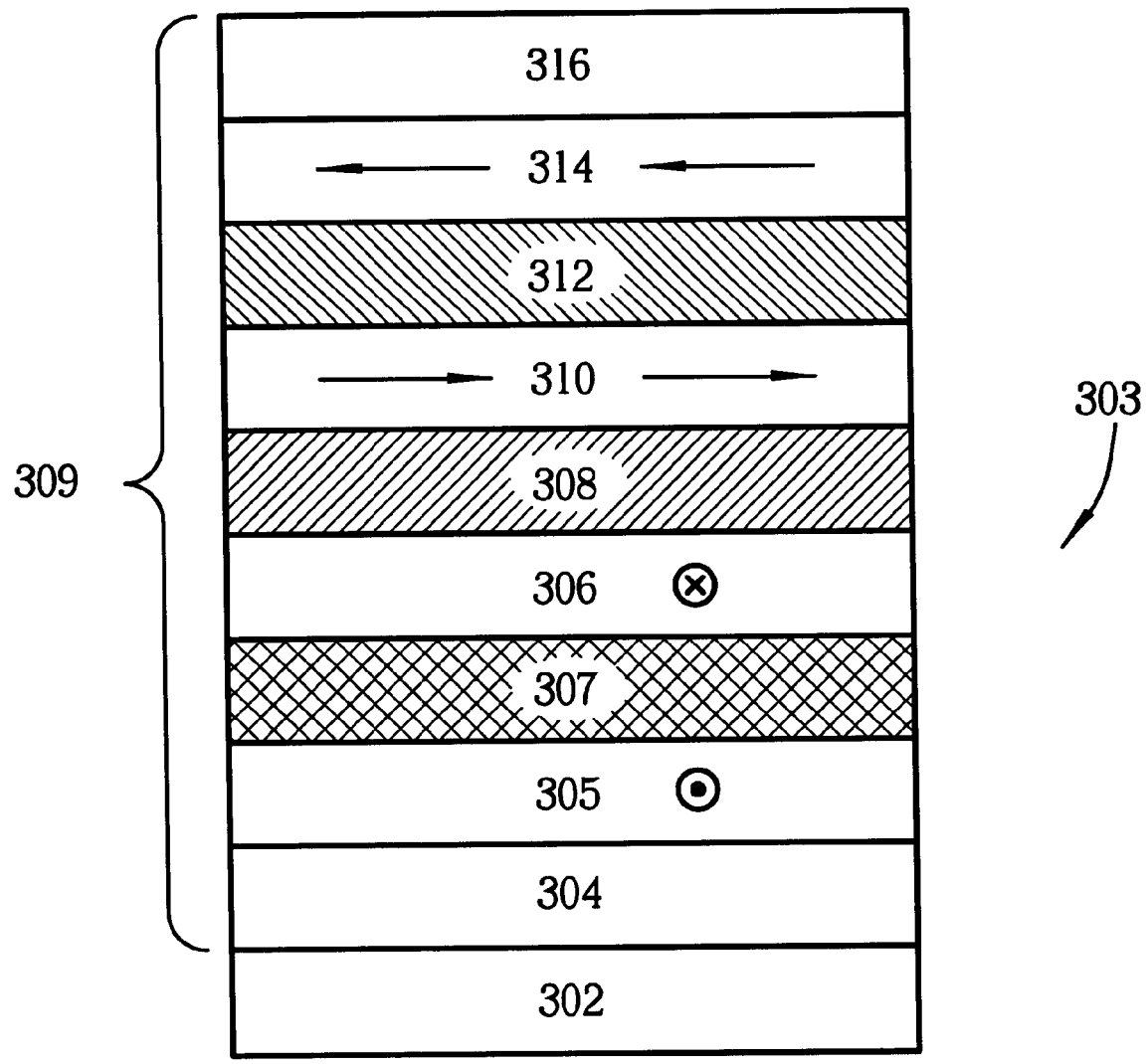
FIG. 3B depicts a cross-sectional schematic diagram of an alternative magnetoresistive sensor with in-stack longitudinal bias.

Alternatively, thin-film layered structure 301 of MR sensor 300 may include an anti-parallel (AP) pinned design as shown in thin-film layered. structure 309 of MR sensor 303 with respect to FIG. 3B. As shown in FIG. 3B, a ferromagnetic "keeper" layer 305 is disposed adjacent to and in contact with the AF layer 304. A non-magnetic spacer layer 307 is disposed between the ferromagnetic "keeper" layer 305 and the ferromagnetic reference layer 306, which has physical properties that promote an anti-ferromagnetic exchange coupling between the ferromagnetic "keeper" layer 305 and the ferromagnetic reference layer 306. The strength of this anti-ferromagnetic exchange coupling is sufficient to maintain essentially rigid, anti-parallel alignment of magnetizations of the ferromagnetic "keeper" layer 305 and the ferromagnetic reference layer 306.

Figure 3C:
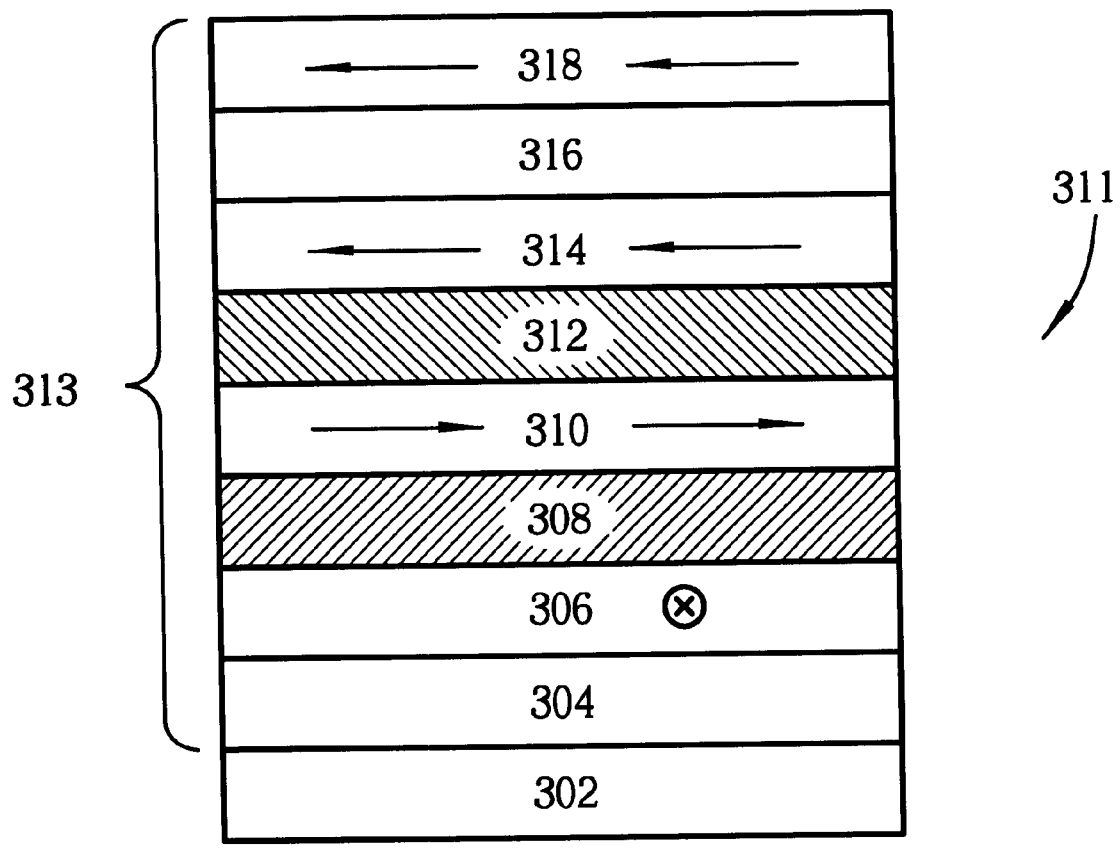
FIG. 3C depicts a cross-sectional schematic diagram of another alternative magnetoresistive sensor with in-stack longitudinal bias.

The thin-film layered structure 301 of MR sensor 300 may optionally include a second auxiliary ferromagnetic layer 318 adjacent to the pinning layer 316 as shown in thin-film layered structure 313 of MR sensor 311 with respect to FIG. 3C. Thin-film layered structure 313 of MR sensor 311 has pinning layer 316 exchange pinning the magnetization of both of the first and second auxiliary ferromagnetic layers 314 and 318. For a given total auxiliary moments $(M_s*t)_a=[(M_s*t)_{314}+(M_s*t)_{318}]$, and given interfacial exchange pinning strength $J_{pin}$ the pinning field. $H_{pin}=J_{pin}/(M_s*t)$ seen by either of auxiliary ferromagnetic layers 314 or 318 can be roughly doubled, since the individual layer thicknesses $t_{314}$ and $t_{318}$ of the first and second auxiliary ferromagnetic layers 314 and 318 respectively would be roughly halved. Hence, the requirement on $J_{pin-crit}$ can be reduced. However, the layer thickness of the pinning layer 316 is typically ten or more times greater than the thickness of second nonmagnetic spacer layer 312, therefore the second auxiliary ferromagnetic layer 318 would not magnetostatically-edge-couple to the ferromagnetic free layer 310 nearly as well as the first auxiliary ferromagnetic layer 314.

Figure 4:
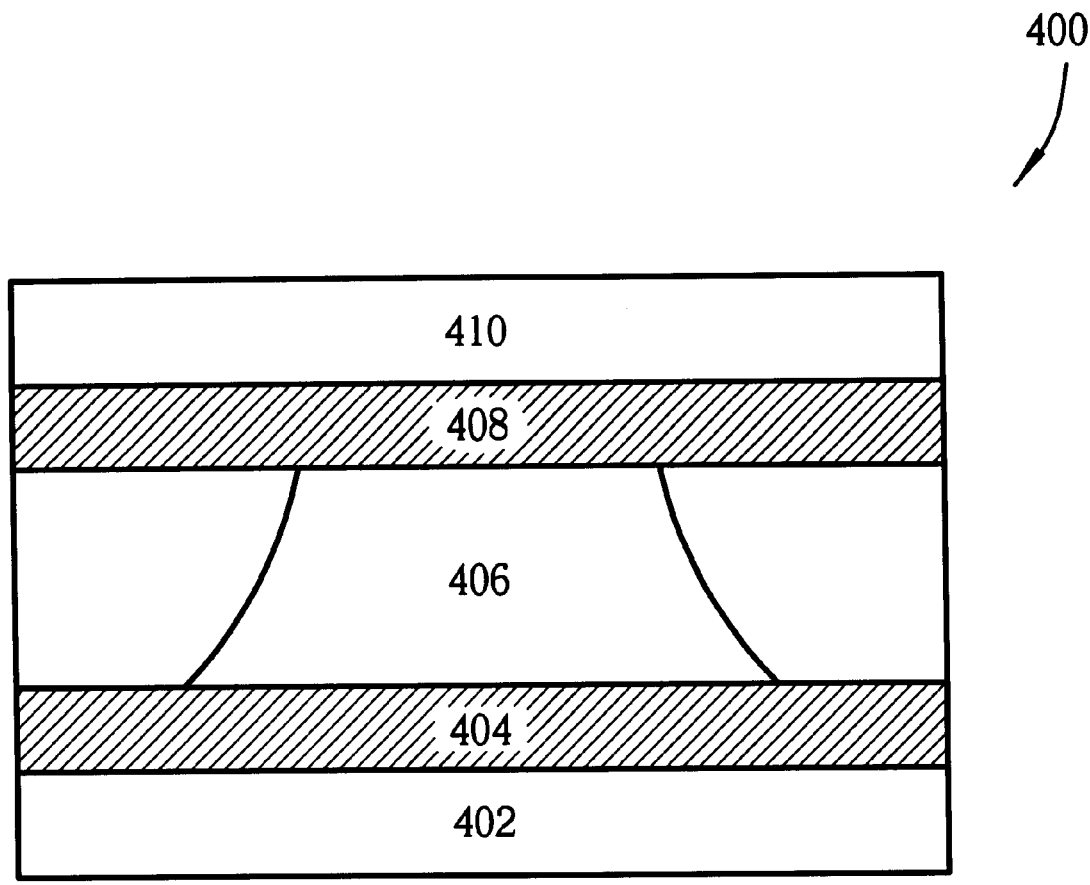
FIG. 4 depicts a MR sensing head including MR sensors of the types depicted in FIGS. 3A–C according to a second embodiment of the present invention.

The MR sensors of the types depicted in FIGS. 3A–3C are incorporated in MR sensing heads according to a second embodiment of the present invention. FIG. 4 depicts a MR sensing head 400, which includes a first shield 402 adjacent to a first nonmagnetic gap layer 404, a second shield 410 adjacent to a second nonmagnetic gap layer 408, and a MR sensor 406 disposed between the first 404 and the second 408 gap layers. MR sensor. 406 has features in common with sensors 300, 303 or 311 described above. MR sensor 406 converts a magnetic signal to an electrical signal by using the magnetoresistive effect generated by a relative angle between magnetization directions of at least two ferromagnetic layers of MR sensor 406.

Figure 5:
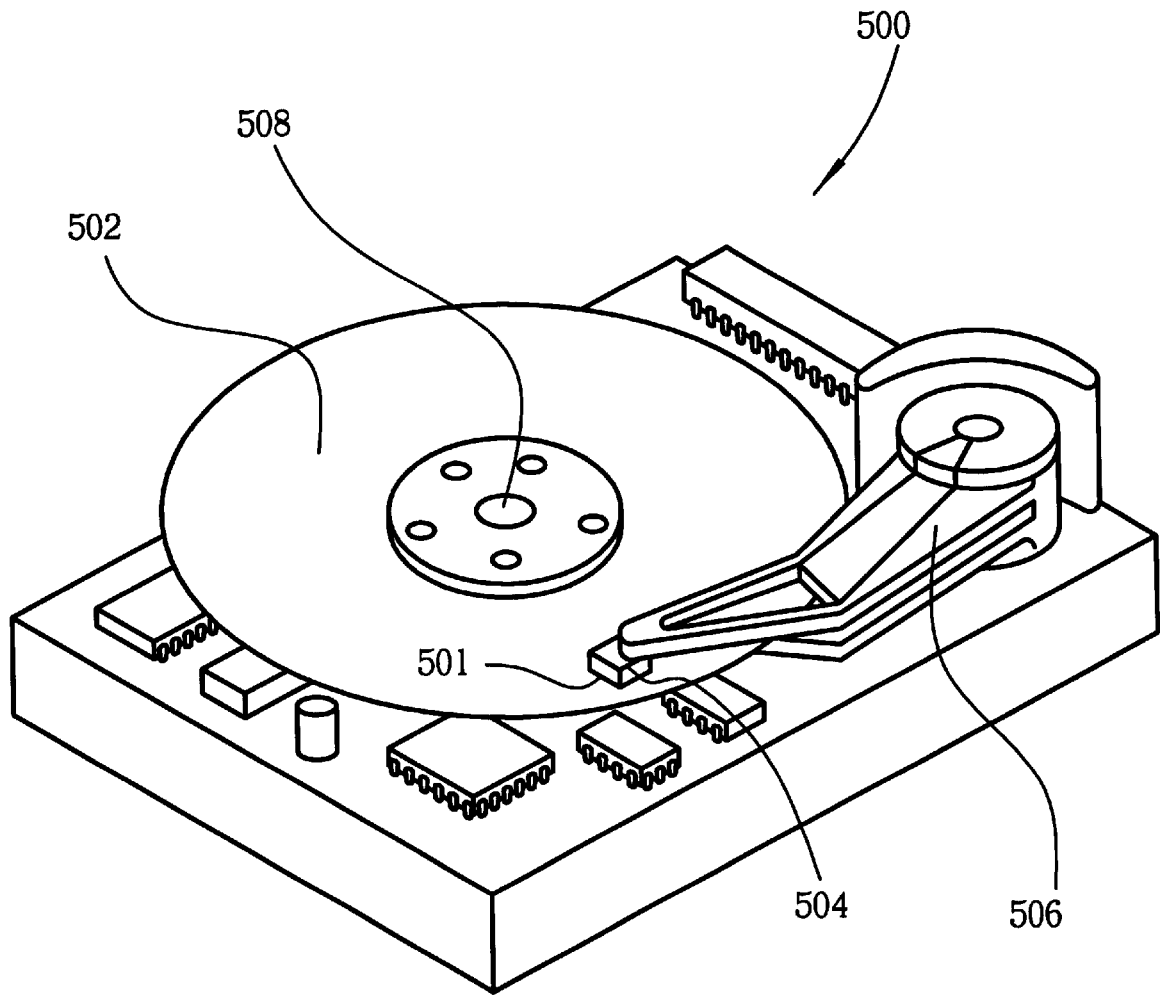
FIG. 5 depicts a disk drive including a MR sensing head of the type depicted in FIG. 4 according to a third embodiment of the present invention.

The MR sensing head depicted in the FIG. 4 may be incorporated into a disk drive 500 as shown in FIG. 5 according to a third embodiment of the present invention. The disk drive 500 generally comprises a magnetic recording disk 502, a MR sensing head 504 containing a MR sensor 501 of the types depicted in FIGS. 3A–C, an actuator 506 connected to the MR sensing head 504, and a motor 508 connected to the magnetic recording disk 502. The motor 508 spins the magnetic recording disk 502 with respect to MR sensing head 504. The actuator 506 moves the MR sensing head 504 across the magnetic recording disk 502 so the MR sensing head 504 may access different regions of magnetically recorded data on the magnetic recording disk 502. Optionally, a disk dive system may include one or more disk drive 500.

It will be clear to one skilled in the art that the above embodiments may be altered in many ways without departing from the scope of the invention. Accordingly, the scope of the invention should be determined by the following claims and their legal equivalents.

What is claimed is:

1. A magnetoresistive (MR) sensor for sensing an external magnetic field comprising:
   a) a substrate; and
   b) a thin-film layered structure formed on the substrate, the layered structure comprising:
      i) a pinned ferromagnetic reference layer;
      ii) a means for pinning a magnetization orientation of the pinned ferromagnetic reference layer along an axis primarily parallel to a direction of the external magnetic field, whereby a magnetization direction of the pinned ferromagnetic reference layer remains essentially fixed in the presence of the external magnetic field;
      iii) a ferromagnetic free layer, a magnetization of which being rotated in the presence of the external magnetic field;
      iv) a first nonmagnetic spacer layer disposed between the ferromagnetic free layer and the ferromagnetic reference layer;
      v) a first auxiliary ferromagnetic layer proximate to the ferromagnetic free layer;
      vi) a second nonmagnetic spacer layer disposed between the ferromagnetic free layer and the first auxiliary ferromagnetic layer, the second nonmagnetic spacer layer having physical properties that induce an anti-ferromagnetic coupling between the ferromagnetic free layer and the first auxiliary ferromagnetic layer; and
      vii) a pinning layer that directly exchange-couples to the first auxiliary ferromagnetic layer along an axis that is primarily orthogonal to the direction of the magnetization of the ferromagnetic reference layer; wherein the magnetization of the ferromagnetic free layer remains stabilized in a direction primarily orthogonal to that of the ferromagnetic reference layer in an absence of the external magnetic field.

2. The MR sensor of claim 1, wherein a mechanism of the anti-ferromagnetic coupling between the ferromagnetic free layer and the first auxiliary ferromagnetic layer is an RKKY-like exchange coupling.

3. The MR sensor of claim 2, wherein a strength of the anti-ferromagnetic coupling is not sufficient to maintain rigid, anti-parallel alignment of the magnetizations of the ferromagnetic free layer and the first auxiliary ferromagnetic layer in the presence of the external magnetic field.

4. The MR sensor of claim 1, wherein the means for pinning the magnetization of the ferromagnetic reference layer comprises an exchange pinning layer made of an anti-ferromagnetic or ferrimagnetic material adjacent to and in contact with the ferromagnetic reference layer.

5. The MR sensor of claim 1, wherein the means for pinning the magnetization of the ferromagnetic reference layer comprises:
   a) an exchange pinning layer made of an anti-ferromagnetic or ferrimagnetic material adjacent to and in contact with a ferromagnetic keeper layer; and
   b) a non-magnetic spacer layer disposed between the ferromagnetic keeper layer and the ferromagnetic reference layer, the non-magnetic spacer layer having physical properties that promote an anti-ferromagnetic exchange coupling between the ferromagnetic keeper layer and the ferromagnetic reference layer, a strength of the anti-ferromagnetic exchange coupling being sufficient to maintain essentially rigid, anti-parallel alignment of the magnetizations of the ferromagnetic keeper layer and the ferromagnetic reference layer in the presence of the external magnetic field.

6. The MR sensor of claim 1, wherein the first nonmagnetic spacer layer comprises an electrically conductive layer.

7. The MR sensor of claim 1, wherein the first nonmagnetic spacer layer comprises an insulating layer, which serves as a tunneling barrier to form a magnetic tunnel junction sensor.

8. The MR sensor of claim 1, wherein the first auxiliary ferromagnetic layer comprises a soft ferromagnetic material selected from the group consisting of Co, Ni, Fe and their alloys.

9. The MR sensor of claim 1, wherein the ferromagnetic free layer comprises a soft ferromagnetic material selected from the group consisting of Co, Ni, Fe and their alloys.

10. The MR sensor of claim 1, wherein a choice of material for the first auxiliary ferromagnetic layer is independent of that of the ferromagnetic free layer.

11. The MR sensor of claim 1, wherein the second nonmagnetic spacer layer comprises a material selected from the group consisting of Ru, Rh, Cr, Ir and their alloys.

12. The MR sensor of claim 1, wherein the pinning layer comprises an anti-ferromagnetic material.

13. The MR sensor of claim 1, wherein the pinning layer comprises a ferrimagnetic material.

14. The MR sensor of claim 1 further comprising a second auxiliary ferromagnetic layer, wherein the pinning layer is disposed between the first and second auxiliary ferromagnetic layer.

15. A MR sensing head comprising:
   a) a first shield proximate a first gap;
   b) a second shield proximate a second gap; and
   c) a MR sensor disposed between the first and second gaps wherein the MR sensor includes:
   j) a substrate; and
   jj) a thin-film layered structure formed on the substrate, the thin-film layer structure comprising:
      i) a pinned ferromagnetic reference layer;
      ii) a means for pinning a magnetization orientation of the pinned ferromagnetic reference layer along an axis primarily parallel to a direction of an external magnetic field to be sensed, whereby a magnetization direction of the pinned ferromagnetic reference layer remains essentially fixed in the presence of the external magnetic field;
      iii) a ferromagnetic free layer, a magnetization of which being rotated in the presence of the external magnetic field;
      iv) a first nonmagnetic spacer layer disposed between the ferromagnetic free layer and the ferromagnetic reference layer;
      v) a first auxiliary ferromagnetic layer proximate to the ferromagnetic free layer;
      vi) a second nonmagnetic spacer layer disposed between the ferromagnetic free layer and the first auxiliary ferromagnetic layer, the second nonmagnetic spacer layer having physical properties that induce an anti-ferromagnetic coupling between the ferromagnetic free layer and the first auxiliary ferromagnetic layer; and
      vii) a pinning layer that directly exchange-couples to the first auxiliary ferromagnetic layer along an axis that is primarily orthogonal to the direction of the magnetization of the ferromagnetic reference;
   wherein the magnetization of the ferromagnetic free layer remains stabilized in a direction primarily orthogonal to that of the ferromagnetic reference layer in an absence of the external magnetic field.

16. The MR sensing head of claim 15, wherein a mechanism of the anti-ferromagnetic coupling between the ferromagnetic free layer and the first auxiliary ferromagnetic layer is an RKKY-like exchange coupling.

17. The MR sensing head of claim 16, wherein a strength of the anti-ferromagnetic coupling is not sufficient to maintain rigid, anti-parallel alignment of the magnetizations of the ferromagnetic free layer and the first auxiliary ferromagnetic layer in the presence of the external magnetic field.

18. The MR sensing:head of claim 15, wherein the means for pinning the magnetization of the ferromagnetic reference layer comprises an exchange pinning layer made of an anti-ferromagnetic or ferrimagnetic material adjacent to and in contact with the ferromagnetic reference layer.

19. The MR sensing head of claim 15, wherein the means for pinning the magnetization of the ferromagnetic reference layer comprises:
   a) an exchange pinning layer made of an anti-ferromagnetic or ferrimagnetic material adjacent to and in contact with a ferromagnetic keeper layer; and
   b) a non-magnetic spacer layer disposed between the ferromagnetic keeper layer and the ferromagnetic reference layer, the non-magnetic spacer layer having physical properties that promote an anti-ferromagnetic exchange coupling between the ferromagnetic keeper layer and the ferromagnetic reference layer, a strength of the anti-ferromagnetic exchange coupling being sufficient to maintain essentially rigid, anti-parallel alignment of the magnetizations of the ferromagnetic keeper layer and the ferromagnetic reference layer in the presence of the external magnetic field.

20. The MR sensing head of claim 15, wherein the first nonmagnetic spacer layer comprises an electrically conductive layer.

21. The MR sensing head of claim 15, wherein the first nonmagnetic spacer layer comprises an insulating layer, which serves as a tunneling barrier to form a magnetic tunnel junction sensor.

22. The MR sensing head of claim 15, wherein the first auxiliary ferromagnetic layer comprises a soft ferromagnetic material selected from the group consisting of Co, Ni, Fe and their alloys.

23. The MR sensing head of claim 15, wherein the ferromagnetic free layer comprises a soft ferromagnetic material selected from the group consisting of Co, Ni, Fe and their alloys.

24. The MR sensing head of claim 15, wherein a choice of the material for the first auxiliary ferromagnetic layer is independent of that for the ferromagnetic free layer.

25. The MR sensing head of claim 15, wherein the second nonmagnetic spacer layer comprises a material selected from the group consisting of Ru, Rh, Cr, Ir and their alloys.

26. The MR sensing head of claim 15, wherein the pinning layer comprises an anti-ferromagnetic material.

27. The MR sensing head of claim 15, wherein the pinning layer comprises a ferrimagnetic material.

28. The MR sensing head of claim 15 further comprising a second auxiliary ferromagnetic layer, wherein the pinning layer is disposed between the first and second auxiliary ferromagnetic layer.

29. A disk drive comprising:
   a) a magnetic recording disk;
   b) a MR sensing head containing a MR sensor;
   c) an actuator for moving the MR sensing head across the magnetic recording disk;
   d) a motor for spinning the magnetic recording disk relative to the MR sensing head wherein the MR sensor includes:
   j) a substrate; and
   jj) a thin-film layered structure formed on the substrate, the thin-film layered structure comprising:
      i) a pinned ferromagnetic reference layer;
      ii) a means for pinning a magnetization orientation of the pinned ferromagnetic reference layer along an axis primarily parallel to a direction of an external magnetic field to be sensed, whereby a magnetization direction of the u ferromagnetic reference layer remains essentially fixed in the presence of the external magnetic field;

iii) a ferromagnetic free layer, a magnetization of which being rotated in the presence of the external magnetic field;

iv) a first nonmagnetic spacer layer disposed between the ferromagnetic free layer and the ferromagnetic reference layer;

v) a first auxiliary ferromagnetic layer proximate to the ferromagnetic free layer;

vi) a second nonmagnetic spacer layer disposed between the ferromagnetic free layer and the first auxiliary ferromagnetic layer, the second nonmagnetic spacer layer having physical properties that induce an anti-ferromagnetic coupling between the ferromagnetic free layer and the first auxiliary ferromagnetic layer; and vii) a pinning layer that directly exchange-couples to the first auxiliary ferromagnetic layer along an axis that is primarily orthogonal to the direction of the magnetization of the ferromagnetic reference wherein the magnetization of the ferromagnetic free layer remains stabilized in a direction primarily orthogonal to that of the ferromagnetic reference layer in an absence of the external magnetic field.

* * * * *